(12) United States Patent
Kubo

(10) Patent No.: US 6,316,364 B1
(45) Date of Patent: Nov. 13, 2001

(54) POLISHING METHOD AND POLISHING SOLUTION

(75) Inventor: Akira Kubo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/503,955

(22) Filed: Feb. 14, 2000

(30) Foreign Application Priority Data

Feb. 15, 1999 (JP) .................................................. 11-036020

(51) Int. Cl.$^7$ ................................................. H01L 21/302
(52) U.S. Cl. .................... 438/692; 438/697; 438/751; 438/754; 451/41; 451/57
(58) Field of Search ........................... 451/41, 57, 371, 451/59; 106/3, 491, 499–450; 216/88, 89; 252/79.2, 79.3; 438/693, 692, 631, 633, 697, 751, 754

(56) References Cited

U.S. PATENT DOCUMENTS

| | | |
|---|---|---|
| 5,575,885 * | 11/1996 | Hirabayashi et al. ............ 156/626.1 |
| 5,631,499 * | 5/1997 | Hosomi et al. ..................... 257/737 |
| 5,662,769 * | 9/1997 | Schonauer et al. ................. 438/633 |
| 5,676,587 * | 10/1997 | Landers et al. ......................... 451/57 |
| 5,968,239 * | 10/1999 | Miyashita et al. ...................... 106/3 |
| 6,117,775 * | 9/2000 | Kondo et al. ......................... 438/690 |
| 6,203,404 * | 3/2001 | Joslyn et al. ........................... 451/37 |
| 6,204,169 * | 3/2001 | Bajaj et al. .......................... 438/645 |

FOREIGN PATENT DOCUMENTS

| | | |
|---|---|---|
| 2-109332 | 4/1990 | (JP) . |
| 8-124886 | 5/1996 | (JP) . |
| 8-139060 | 5/1996 | (JP) . |
| 10-172969 | 6/1998 | (JP) . |

* cited by examiner

Primary Examiner—George Nguyen
(74) Attorney, Agent, or Firm—Hayes, Soloway, Hennessey, Grossman & Hage, P.C.

(57) ABSTRACT

Dents are formed on the silicon oxide film 3 formed on a silicon substrate 1; thereon are formed a barrier metal film 4 and a copper plating film 5 in this order. Then, chemical mechanical polishing is conducted for planarization. Polishing is conducted for a given time and, when the barrier metal film 4 has been exposed, a hydrofluoric acid-containing solution is fed. As the hydrofluoric acid-containing solution, a buffered hydrofluoric acid or the like is used.

14 Claims, 7 Drawing Sheets

POLISHING METHOD AND POLISHING SOLUTION

BACKGROUND OF THE INVENTION

1. Field of the Invention

The present invention relates to a CMP (chemical mechanical polishing) method for planarizing the surface of a wafer, used in the course of a process for production of a semiconductor device having damascene interconnection and through holes, as well as to a polishing solution used in the CMP method.

2. Description of the Related Art

In semiconductor integrated circuit devices having multilayer wiring, a lower wiring is formed on a substrate; thereon is formed an insulating film; in the insulating film are formed via holes for connecting the lower wiring with an upper wiring to be formed later; then, a metal film is formed on the insulating film; the metal film is subjected to patterning by lithography and etching to form an upper wiring. In this case, since the surface of the insulating film has unevennesses owing to the presence of the lower wiring, various inconveniences arise when an upper wiring is formed with the above unevennesses are left as they are. That is, formation of fine pattern is difficult because the lithography necessary for formation of upper wiring need be conducted for the metal film having surface unevennesses; further, leakage may appear in the insulating film or the upper wiring may cause disconnection. Therefore, the surface of the insulating film (which becomes a base for upper wiring formation) is preferred to be planarized as sufficiently as possible.

As a technique for such planarization, chemical mechanical polishing (CMP) is in wide use. Description is made below on a conventional method for formation of damascene interconnection by CMP, with reference to FIG. 4.

Firstly, as shown in FIG. 4(a), a silicon nitride film 2 (thickness=100 nm) and a silicon oxide film 3 (thickness=1,000 nm) are formed in this order on a silicon substrate 1; then, in the silicon oxide film 3 are formed, by dry etching, a plurality of dents reaching the silicon nitride film 2.

Next, as shown in FIG. 4(b), on the whole surface of the resulting wafer is formed, by sputtering, a barrier metal 4 made of Ta and TaN. The film thickness is controlled at 20 nm. Successively, thereon is formed, by sputtering, a seed metal film (not shown) made of copper, for growing copper plating thereon. Successively, the resulting wafer is immersed in an aqueous copper sulfate solution of about 25° C. and electrolytic plating is conducted to form a copper plating film 5. The thickness of the copper plating film 5 is controlled at about 900 nm at the flat portion. This state is shown in FIG. 4(b).

The wafer after plating is subjected to annealing at 300° C. for about 30 minutes. Thereby, the grain size of copper is made larger and its resistance becomes smaller.

Next, the copper plating film 5 is polished by CMP for planarization of wafer. CMP is conducted ordinarily by using a polishing apparatus such as shown in FIG. 5. In FIG. 5, a wafer 10 refers to a wafer obtained by forming films on a substrate 1 in the manner mentioned above. The wafer 10 is placed beneath a wafer carrier 11. While the film-side surface of the wafer 10 is contacted with a polishing pad 12, both the wafer carrier 11 and the polishing pad 12 are rotated at respective given speeds. Between the wafer 10 and the polishing pad 12 is fed a polishing solution 14 from a discharging port 13 by a pump 15.

As the polishing solution 14, there is generally used a slurry in which an abrasive such as alumina particles, silica particles or the like is dispersed. Ordinarily, a slurry for metal polishing or a slurry for insulating film polishing is used depending upon the progress of polishing, because the polishing speed of metal film and the polishing speed of insulating film are greatly different and no sufficient planarization is obtained unless a different polishing solution is used depending upon the kind of the polishing surface. For example, a slurry for metal polishing is used in the stage of FIG. 4(b), and a slurry for insulating film polishing is used in the stages of FIGS. 4(c) to 4(d).

Various proposals have been made on the selection of the polishing solution 14. In JP-A-8-124886 is disclosed a method of using first a polishing solution for metal, then a neutral polishing solution and lastly an alkaline polishing solution for insulating film. In JP-A8-139060 is disclosed a method of polishing a metal film using an acidic polishing solution and then polishing an insulating film using an alkaline polishing solution. Thus, by appropriately selecting the kind of polishing solution depending upon the kind of wafer surface, planarization by a simple process is made possible.

Then, polishing is continued for a given length of time; a state shown in FIG. 4(d) is attained; and damascene interconnection is completed.

The above-mentioned conventional technique, however, has had the following problems.

The first problem is generation of dishing in buried metal parts. In the CMP of FIG. 4(c), a sufficient polishing time must be taken so that no barrier metal film 4 remains on the silicon oxide film 3. The polishing speed of the copper plating film 5 is very large as compared with that of the barrier metal film 4 and is ordinarily at least 30-fold as compared with that of Ta type metal generally used as a barrier metal film. Therefore, as shown in FIG. 3(c), the polishing of copper plating film 5 proceeds excessively as compared with that of the barrier metal film 4, in the step conducted after the exposure of the barrier metal film 4 and the center of the metal film 3 is dented as shown in FIG. 7. This phenomenon is called dishing. Since the barrier metal film 4 on the insulating film 3 must be removed substantially completely, slightly excessive etching is necessary; hence, certain dishing inevitably generates ordinarily. This generation of dishing of copper layer results in local increase of resistance. Further, electromigration may be induced, resulting in reduced reliability of device.

A second problem is generation of erosion. As described above, a slightly excessive polishing time is necessary in the CMP of FIG. 4(c). The polishing speed of copper plating film 5 is very large as compared with those of the barrier metal film 4 and the silicon oxide film 3 and the copper plating film is polished faster. Therefore, In the CMP conducted after the barrier metal film 4 has been exposed, the speed of CMP differs between the concentrated-wiring region and the isolated-wiring region. That is, the pressures applied to the barrier metal film 4 and the silicon oxide film 3 are higher in the concentrated-wiring region where a number of buried parts of copper plating film 5 are present, than in the isolated-wiring region where a very small number of buried part of copper plating film 5 is present. As a result, CMP proceeds excessively in the concentrated-wiring region and surface denting takes place as shown in FIG. 4(d). This phenomenon is called erosion.

The generation of erosion results in reduction in flatness of wafer surface. The reduction in flatness is more striking in a multi-layer structure and induces problems such as short-circuiting in wiring, and the like. Further, when damascene interconnection has been formed, the sectional area becomes smaller and the resistance becomes larger.

As described above, the erosion and dishing generate owing to the difference in polishing speed between copper and barrier metal film or insulating film. In the practical process for production of semiconductor device, however, the erosion and dishing are further promoted by the process parameters other than mentioned above. Description is made on this below.

FIG. 6(a). is a drawing showing a state of the surface of a wafer when a polishing solution has been fed onto the surface. The wafer and a polishing pad are being rotated at about the same speeds in the same direction. When polishing is conducted under such conditions, the outer circumference of wafer has a larger speed than the inner circumference of wafer and consequently contacts with a larger area of pad per unit time. (See FIG. 6(b)). As a result, polishing proceeds more in the outer circumference of wafer than in the inner circumference of wafer. Further, with respect to the distribution of polishing solution on wafer, there arises non-uniformity between the outer circumference and the inner circumference. The polishing solution dropped on the polishing pad migrates from the outer circumference of wafer toward the inner circumference of wafer and spreads over the entire surface of wafer. In this case, the time-average concentration of polishing solution is higher in the outer circumference of wafer than in the inner circumference of wafer. This also becomes a parameter which makes the polishing of outer circumference more than that of inner circumference. The wafer having, on the surface, a metal film and an insulating film has upward warpage at the film side. Therefore, when the wafer is pressed against the polishing pad 12 to conduct polishing, the warpage remains to a certain degree and the outer circumference of wafer tends to be polished more.

Thus the outer circumference of wafer tends to be polished more than the inner circumference of wafer, owing to various parameters of process. Therefore, in order to achieve flatness over the entire surface of wafer, the polishing time need be taken even longer. This makes erosion and dishing more striking.

SUMMARY OF THE INVENTION

The present invention has been made in order to alleviate the above problems, and aims at prevention of generation of erosion and dishing in the CMP conducted for formation of damascene interconnection, plugs, etc.

According to the present invention, there is provided a polishing method which comprises, after (1) formation of an insulating film on a wafer, (2) formation of dents at given positions of the insulating film, and (3) formation of a barrier metal film and a metal film on the whole surface of the resulting wafer in this order, contacting a polishing pad with the surface of the wafer under a load and rotating at least either of the polishing pad and the wafer to planarize the surface of the wafer, wherein a first polishing solution is fed onto the wafer for a given time from the start of polishing and, when the given time has passed, a second polishing solution containing hydrofluoric acid is fed.

In the above polishing method, a second polishing solution containing hydrofluoric acid is fed when a given time has passed from the start of polishing. Hydrofluoric acid dissolves the barrier metal film and the insulating film, but has no solubility for metals of low ionic tendency such as copper and the like. Therefore, when the second polishing solution containing hydrofluoric acid is fed at a timing when the barrier metal film and the insulating film have been exposed, the barrier metal film and the insulating film are dissolved and removed selectively. As a result, there can be effectively prevented the erosion and dishing caused by the difference in polishing speed between (a) the barrier metal film and the insulating film and (b) the metal film.

As described previously, a technique using an acidic solution as a polishing solution for metal film is already known. In contrast, the polishing method of the present invention comprises using hydrofluoric acid to selectively dissolve a barrier metal film and an insulating film to prevent erosion and dishing. The present inventor found out that use of an acid, particularly a hydrofluoric acid-based solution can show the above action (selective dissolution of barrier metal film and insulating film); and the present invention was completed based on the above finding. It was confirmed that, for example, a Ta-based metal widely used as a barrier metal film has a very high resistance to chemical solutions and is soluble only in limited chemicals such as hydrofluoric acid, fuming sulfuric acid, high-concentration alkali solution and the like. The present inventor investigated on the applicability of these chemicals to CMP and found out that a hydrofluoric acid-containing solution is suitable for use in CMP.

In the above polishing method, as the first polishing solution and the second polishing solution, there can be used a slurry in which an abrasive such as alumina particles, silica particles or the like is dispersed. As to the components of the solutions, there is no particular restriction as long as hydrofluoric acid is contained in the second polishing solution.

According to the present invention, there is also provided a polishing method which comprises, after (1) formation of an insulating film on a wafer, (2) formation of dents at given positions of the insulating film, and (3) formation of a barrier metal film and a metal film on the whole surface of the resulting wafer in this order, contacting a polishing pad with the surface of the wafer under a load and rotating at least either of the polishing pad and the wafer with a polishing solution being fed onto the wafer, to planarize the surface of the wafer, wherein a hydrofluoric acid-containing solution is fed onto the wafer when a given time has passed from the start of polishing.

In the above polishing method, as the polishing solution, there can be used a slurry in which an abrasive such as alumina particles, silica particles or the like is dispersed. As to the components of the solution, there is no particular restriction. Meanwhile, the hydrofluoric acid-containing solution is different from the polishing solution and preferably contains no abrasive.

In the above polishing method, the following effect is obtained in addition to the previously-mentioned effect, i.e. the prevention of erosion and dishing, brought about by the hydrofluoric acid's solubility for barrier metal film and insulating film.

That is, since the hydrofluoric acid-containing solution and the polishing solution can be added independently, the amount of the hydrofluoric acid-containing solution added can be appropriately controlled depending upon the kind and thickness of the barrier metal film, whereby polishing can be appropriately controlled in each process. FIG. 2 shows an example of the polishing apparatus used in the polishing method of the present invention. As shown in FIG. 2, the feeding of a hydrofluoric acid-containing solution 16 for dissolution of barrier metal film is conducted independently from the feeding of a polishing solution 14 for execution of polishing. Therefore, the proportion of the polishing solution 14 and the hydrofluoric acid-containing solution 16 added can be optimized in view of the polishing speed ratio of barrier metal film and metal film, the thicknesses of the two films, etc., whereby even higher flatness can be obtained.

In the above polishing method, the following effects can also be obtained by using a hydrofluoric acid-containing solution containing no abrasive, for example, an aqueous hydrofluoric acid solution.

Firstly, one kind of polishing solution can be used. Since the polishing solution is generally expensive, use of minimum kinds of polishing solutions is preferred. In the present polishing method, since the hydrofluoric acid-containing solution and the polishing solution are added independently, the addition amount and addition timing of hydrofluoric acid-containing solution are controlled appropriately, whereby use of a single polishing solution in various CMP conditions is made possible.

Secondly, generation of microscratches can be prevented. In ordinary CMP, in the polishing step after a barrier metal film has been removed and an insulating film has been exposed, the abrasive contained in the polishing solution used generates microscratches on the insulating film. Generation of microscratches makes difficult the registration conducted in the later lithography step. Further, the metal for wiring, grown in the next step remains in the microscratches, which may induce short-circuiting.

According to the present invention, there is further provided a polishing solution used when, after (1) formation of an insulating film on a wafer, (2) formation of dents at given positions of the insulating film, and (3) formation of a barrier metal film and a metal film on the whole surface of the resulting wafer in this order, the surface of the wafer is polished with a polishing pad, which polishing solution contains hydrofluoric acid.

With this polishing solution, the barrier metal film and the insulating film can be selectively dissolved and removed as previously described, and the erosion and dishing occurring owing to the difference in the polishing speed between (a) the barrier metal film and the insulating film and (b) the metal film can be prevented effectively.

DETAILED DESCRIPTION OF THE PREFERRED EMBODIMENTS

Figure 1:
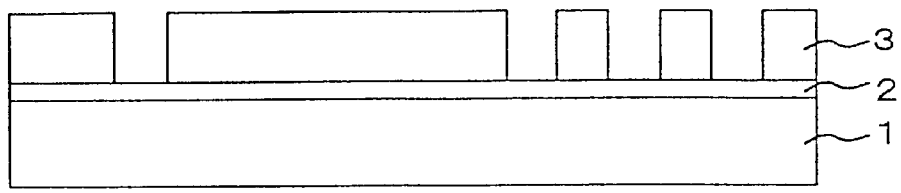
FIGS. 1(a)–1(d) are sectional views showing steps of the polishing method of the present invention.
Figure 1:
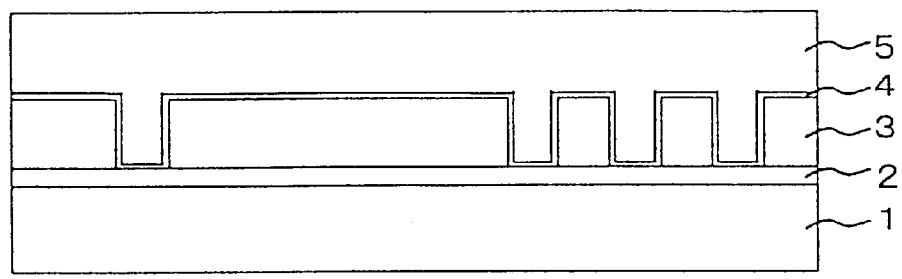
Figure 1:
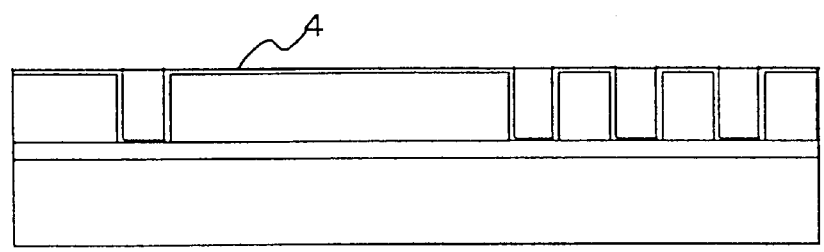
Figure 1:
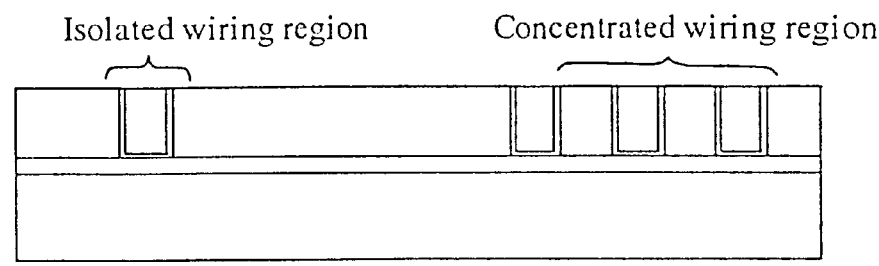

In the present invention, the second polishing solution or the hydrofluoric acid-containing solution preferably contains a buffered hydrofluoric acid, dilute hydrofluoric acid or a mixture of hydrofluoric acid and hydrogen peroxide. Such a solution shows good solubility for barrier metal film and insulating film and can prevent dishing and erosion effectively. Herein, the buffered hydrofluoric acid refers to a buffer solution containing hydrofluoric acid, for example, a mixture of hydrofluoric acid and ammonium fluoride.

In the present invention, the concentration of hydrofluoric acid in the second polishing solution or the hydrofluoric acid-containing solution is preferably 1 to 50% by weight, more preferably 10 to 30% by weight. By thus controlling the hydrofluoric acid concentration, the second polishing solution or the hydrofluoric acid-containing solution can have a higher solubility for the barrier metal film and the insulating film, and dishing and erosion can be prevented more effectively.

In the present invention, the barrier metal film is a film for prevention of the diffusion of metal film into insulating film. As the barrier metal film, there is used a Ta film, a TaN film, a Ti film, a TiN film, a W film, a WN film or a lamination film thereof. The barrier metal film can be formed by PVD, CVD or the like.

The present invention exhibits a more striking effect when the barrier metal film contains Ta or Ti, particularly Ta and/or TaN. Such a film is in wide use as a barrier metal film; in particular, Ta or TaN is used suitably as a barrier metal for buried metal (e.g. Cu) film because they show high barrier property. Such a film, however, is hard and is resistant to CMP and has had a problem of easily giving rise to dishing and erosion. In the present invention, this problem is solved and the barrier metal film made of the above material can exhibit a high barrier property.

In the present invention, the metal film is preferably made of copper, silver or an alloy thereof, particularly preferably of a copper-based metal such as copper or copper alloy. The reason is that these metals are low in resistance and hardly cause electromigration or the like. With respect to the method for formation of the metal film, there is no particular restriction, and there can be mentioned plating, CVD, sputtering, etc. In using plating, it is possible to conduct plating after formation of a seed metal film.

In the polishing method of the present invention, the timing at which the second polishing solution containing hydrofluoric acid or the hydrofluoric acid-containing solution is fed, is preferably when the barrier metal film has been exposed and after the rotational torque of wafer or polishing pad has reached a given level. Up to a certain timing of CMP, the metal film is polished and, when this timing has passed, the barrier metal film is exposed. When the barrier metal film has been exposed, the rotational torque changes owing to the difference in hardness between the metal film and the barrier metal film; therefore, it is preferred to feed, at this timing, the hydrofluoric acid-containing solution or the like. Thereby, the dissolution of the barrier metal film proceeds and dishing and erosion can be prevented effectively.

In the present invention, "dents" refer to holes or grooves for forming damascene interconnection or plugs therein. A metal film of copper or the like is buried in the dents, whereby damascene interconnection or plugs are formed. The width of each dent is, for example, about 0.1 to 1 μm.

In the present invention, as the insulating film, there can be used a conventional low dielectric constant film such as silicon oxide film, silicon nitride film, SOG (spin on glass) film or the like. Regarding the SOG film, there is no particular restriction as to the kind, and there can be used an inorganic SOG film, an organic SOG film, a HSQ (hydrogen silsesquioxane) film or the like.

The SOG film, particularly the HSQ film or the organic SOG film is well balanced in dielectric constant, gas generation, etc. and can be used preferably as an inter-layer insulating film. These films, however, are high in CMP speed and easily give rise to erosion and microscratches. In the present invention, this defect can be avoided and the excellent properties of the above films can be utilized.

In the present invention, the dishing and erosion caused by the difference in polishing speed between the barrier metal film and the metal film can be prevented. Therefore, the present invention can be applied to any process where the difference in polishing speed between the barrier metal film and the metal film becomes a problem, and can be widely used in a process for formation of damascene interconnection, a process for formation of inter-layer contact plugs, etc. The present invention can be applied to, for example, a process wherein a barrier metal film of Ti/TiN, WN or the like is formed in contact holes, a W film is formed thereon, and then CMP is conducted. The present invention can be applied also to a process wherein a barrier metal film made of Ta or the like is formed in via holes, a copper film is formed thereon, and then CMP is conducted.

An example of the present invention is described below with reference to FIG. 1.

First, as shown in FIG. 1(a), a silicon nitride film 2 (thickness=100 nm) and a silicon oxide film 3 (thickness=1,000 nm) were formed in this order on a silicon substrate 1, after which a plurality of dents reaching the silicon nitride film 2 were formed at given positions, by dry etching. Thereby, a concentrated wiring region and an isolated-wiring region are formed as shown in FIG. 1(a). Herein, the concentrated-wiring region refers to a region wherein a plurality of dents are formed at intervals of about 1 to 3 times the width of each dent, particularly a region wherein at least three dents are formed at intervals of about the same as the width of each dent.

Next, as shown in FIG. 1(b), a barrier metal film 4 made of TaN was formed on the whole surface of the resulting wafer, by sputtering. The film thickness was controlled at 20 nm. Successively, thereon was formed, by sputtering, a seed metal film (not shown) made of copper, for growing copper plating thereon. Successively, the resulting wafer was immersed in an aqueous copper sulfate solution of about 25° C. and electrolytic plating was conducted to form a copper plating film 5 made of copper. The thickness of the copper plating film was controlled at about 900 nm at the flat portion. This state is shown in FIG. 1(b).

The wafer after plating was subjected to annealing at 300° C. for about 30 minutes. Thereby, the grain size of copper becomes larger an the resistance thereof becomes lower.

Figure 2:
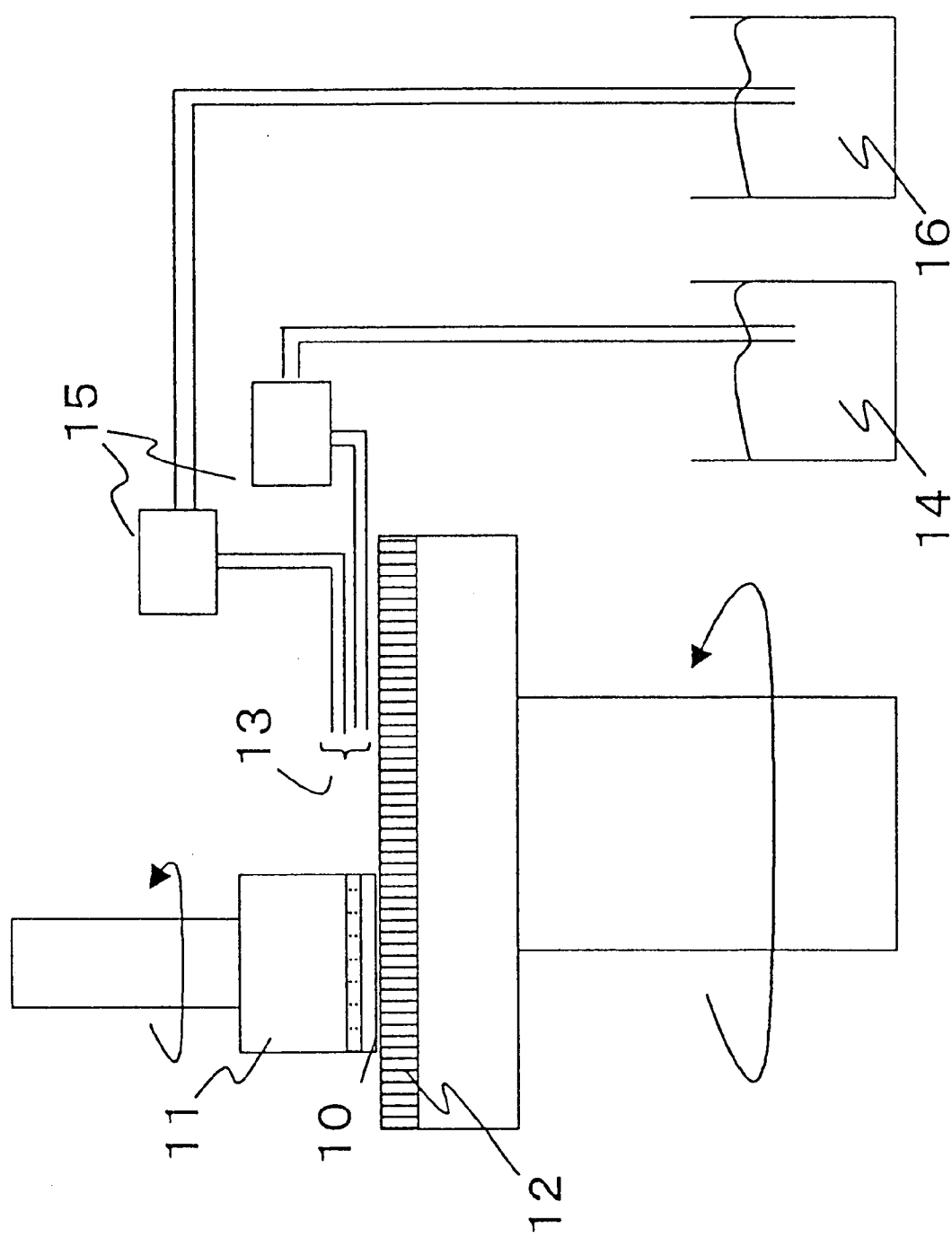
FIG. 2 is a schematic view of the CMP apparatus used in the polishing method of the present invention.

After the annealing, CMP was conducted using a polishing apparatus shown in FIG. 2. In FIG. 2, a wafer 10 means a wafer obtained by forming films on a substrate 1 in the manner mentioned above. The wafer 10 was provided beneath the bottom of a wafer carrier 11. The surface of the wafer 10 was contacted with a polishing pad 12 and, in this state, both the wafer carrier 11 and the polishing pad 12 were rotated at given speeds. Between the wafer 10 and the polishing pad 12 was fed a polishing solution 14 from a discharging port 13 by a pump 15. As the polishing solution was used a solution obtained by adding alumina particles to a solution containing aqueous hydrogen peroxide and iron sulfate. A polishing pressure of about 3 to 5 psi was applied.

When polishing was continued for a certain time, the rotational torque of CMP increased. At this time, the wafer has a sectional structure as shown in FIG. 1(c). That is, the copper plating film 5 on the flat portion of the insulating film is removed and the barrier metal film 4 is exposed. The TaN constituting the barrier metal film 4 is harder than the copper constituting the copper plating film 5 and is resistant to CMP. Therefore, the rotational torque increases when TaN has been exposed as shown in FIG. 1(C).

Figure 3:
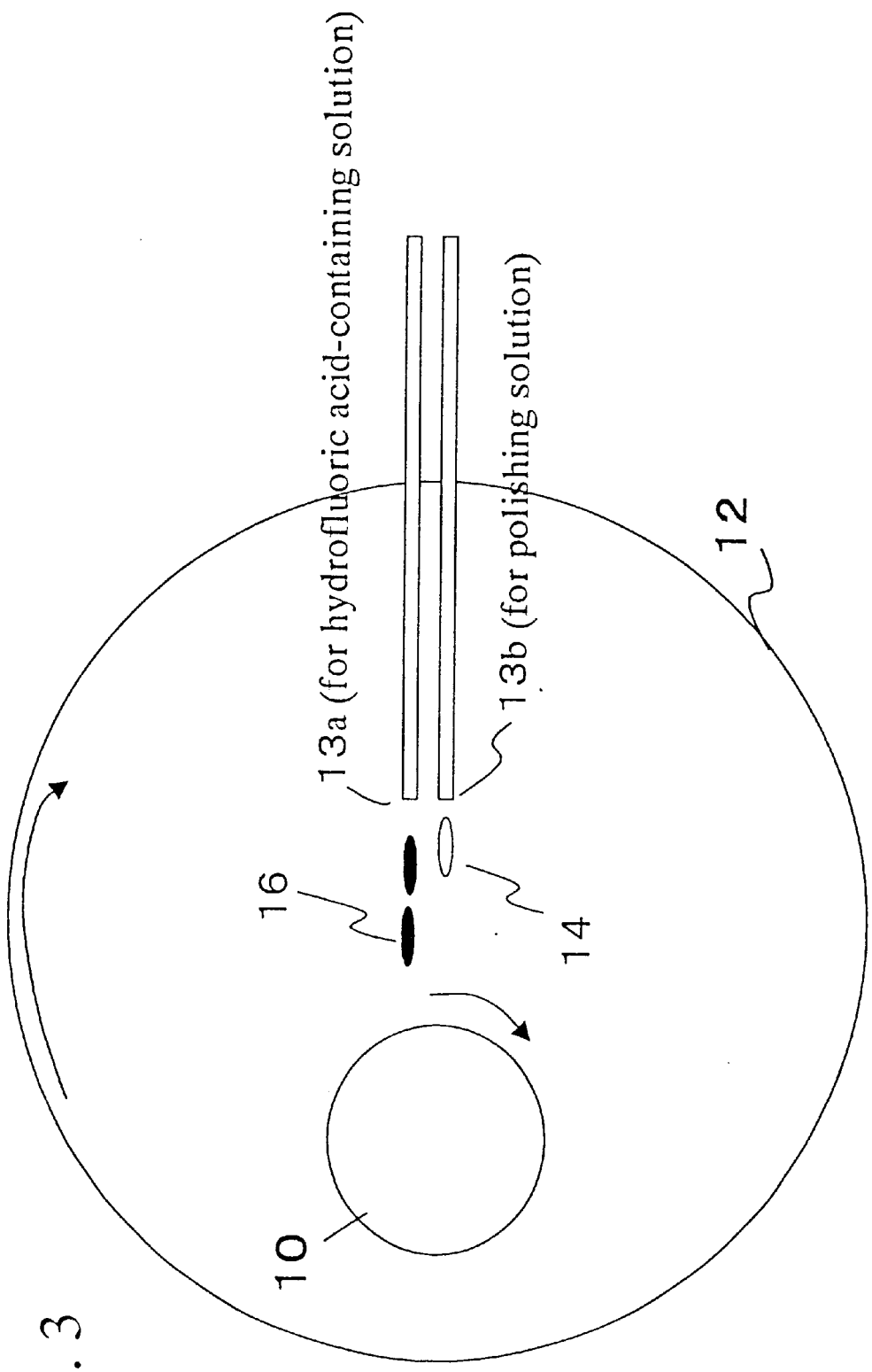
FIG. 3 is a drawing showing a state of the surface of a wafer when a polishing solution has been fed onto the surface in the polishing method of the present invention.
Figure 4:
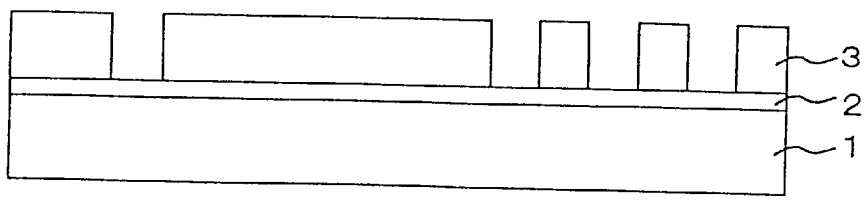
FIGS. 4(a)–4(d) are sectional views showing steps of a conventional polishing method.
Figure 4:
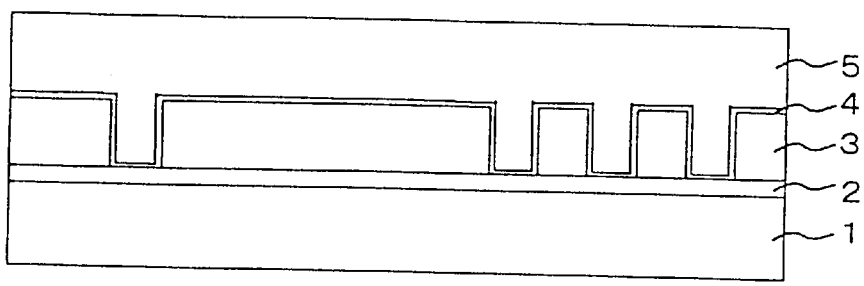
Figure 4:
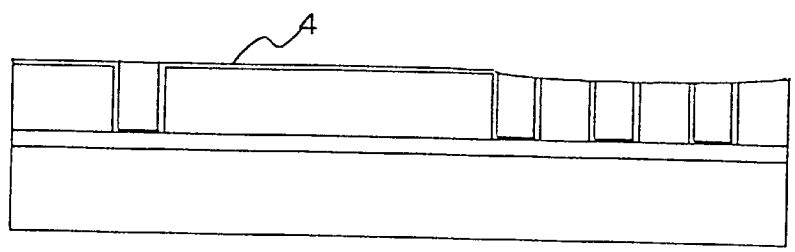
Figure 4:
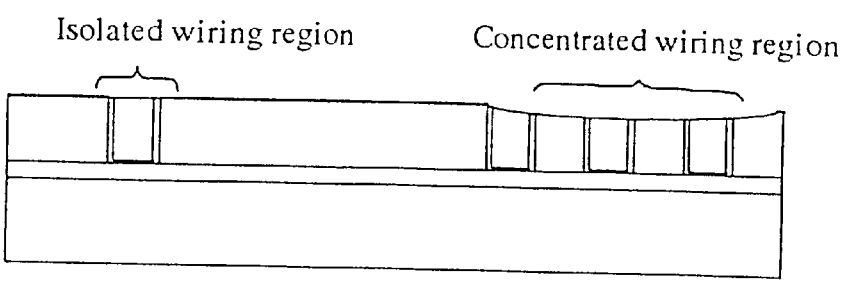
Figure 5:
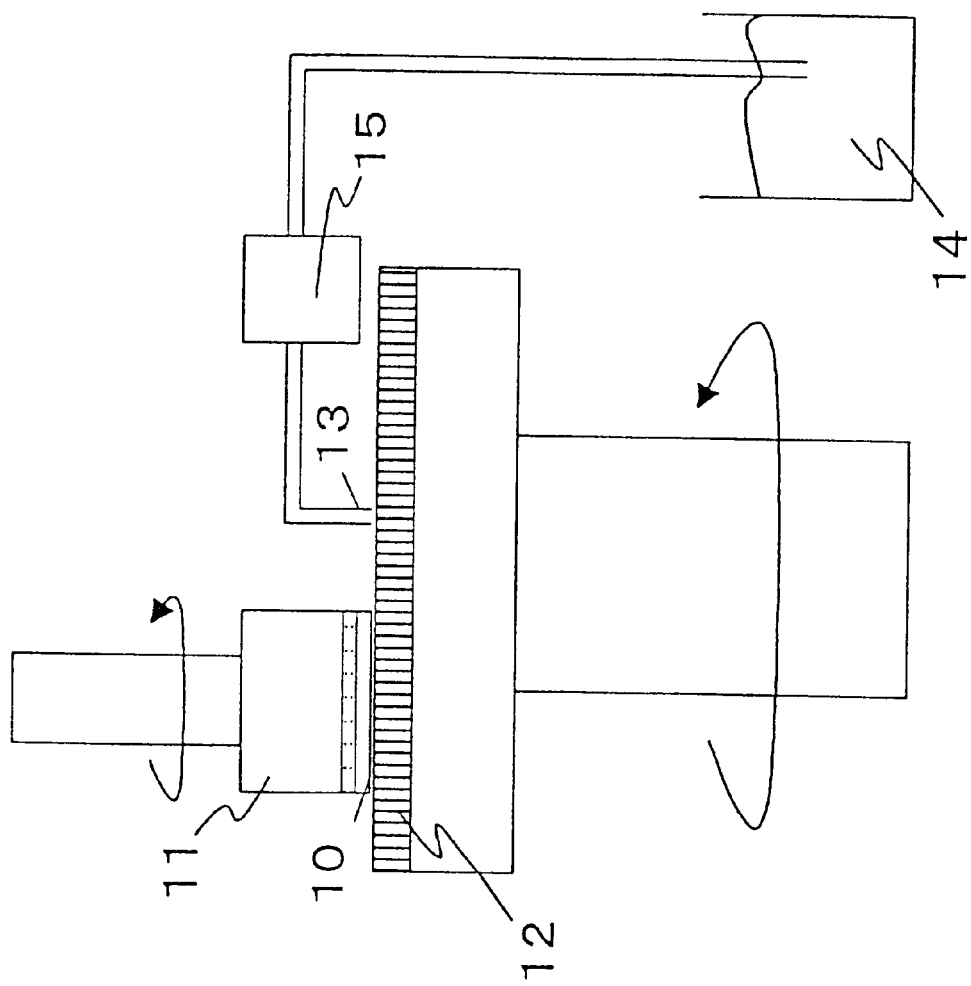
FIG. 5 is a schematic view of the CMP apparatus used in a conventional polishing method.
Figure 6:
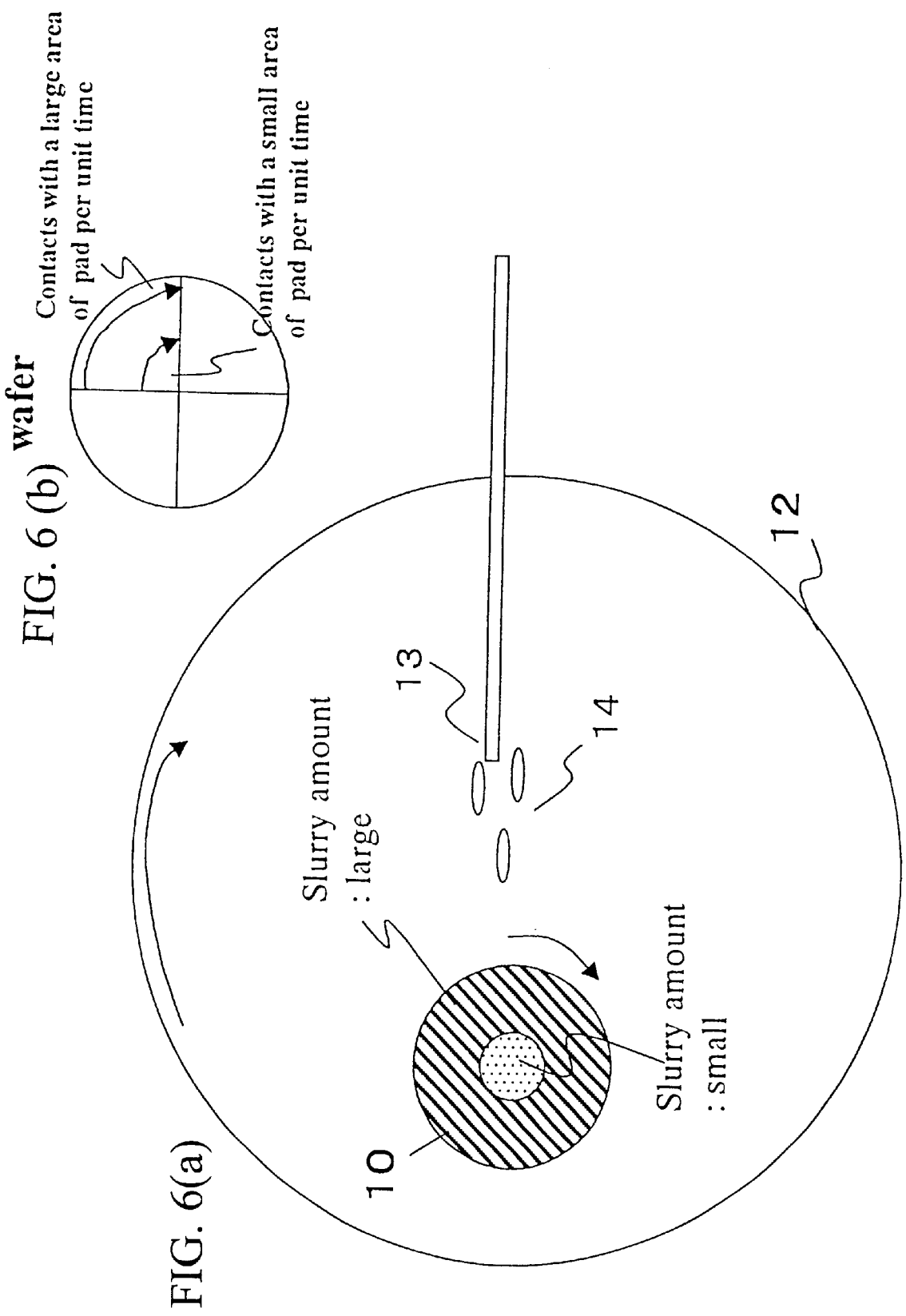
FIGS. 6(a)–6(d) are drawings showing a state of the surface of a wafer when a polishing solution has been fed onto the surface in a conventional polishing method.
Figure 7:
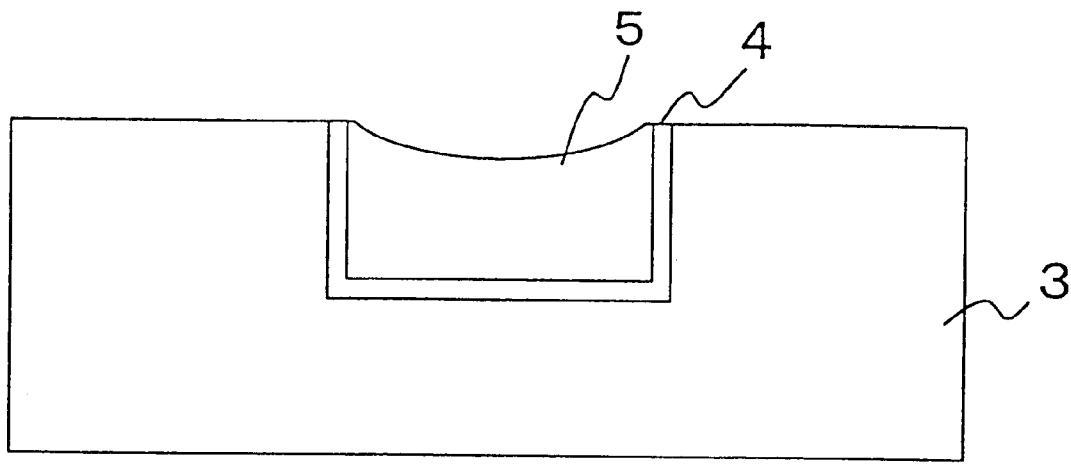
FIG. 7 is a drawing showing a state in which dishing has generated.

When the rotational torque increased, a buffered hydrofluoric acid 16 was fed between the wafer 10 and the polishing pad 12 from the discharging port 13 of FIG. 2. FIG. 3 is a drawing showing a state of the surface of wafer when the buffered hydrofluoric acid has been fed. The polishing solution 14 and the buffered hydrofluoric acid 16 are fed from the discharging port 13a and 13b by individual pumps.

Thereafter, polishing was continued for a given time, whereby damascene interconnection such as shown in FIG. 1(d) was completed. The completion timing of CMP was determined by a method of detecting the change of the rotational torque of CMP.

The thus-completed semiconductor device was evaluated for surface flatness by using an AFM (atomic force microscope) or a three-dimensional profiler of stylus type, which confirmed that the semiconductor device produced by the present example had a very flat surface.

As described above, the present invention, which feeds a hydrofluoric acid-containing solution onto a wafer surface at a given timing after the start of polishing, can prevent dishing and erosion effectively. Further, by using a hydrofluoric acid-containing solution containing no abrasive, the generation of microscratches on oxide film surface can be prevented.

This application is based on Japanese patent application No. HEI11-036020, the content of which is incorporated hereinto by reference.

What is claimed is:

1. A polishing method which comprises, after (1) formation of an insulating film on a wafer, (2) formation of dents at given positions of the insulating film, and (3) formation of a barrier metal film and a metal film on the whole surface of the resulting wafer in this order, contacting a polishing pad with the surface of the wafer under a load and rotating at least either of the polishing pad and the wafer to planarize the surface of the wafer to expose the barrier metal film, wherein a first polishing solution is fed onto the wafer for a given time from the start of polishing and, when the given time has passed and the barrier metal film is exposed, a second polishing solution containing hydrofluoric acid is fed.

2. A polishing method according to claim 1, wherein the second polishing solution contains a buffered hydrofluoric acid, dilute hydrofluoric acid or a mixture of hydrogen peroxide and hydrofluoric acid.

3. A polishing method according to claim 1, wherein the concentration of hydrofluoric acid in the second polishing solution is 1 to 50% by weight.

4. A polishing method which comprises, after (1) formation of an insulating film on a wafer, (2) formation of dents at given positions of the insulating film, and (3) formation of a barrier metal film and a metal film on the whole surface of the resulting wafer in this order, contacting a polishing pad with the surface of the wafer under a load and rotating at least either of the polishing pad and the wafer with a polishing solution being fed onto the wafer, to planarize the surface of the wafer, and expose the barrier metal film, and feeding a hydrofluoric acid-containing solution onto the wafer.

5. A polishing method according to claim 4, wherein the hydrofluoric acid-containing solution contains no abrasive.

6. A polishing method according to claim 4, wherein a single polishing solution is used as the polishing solution.

7. A polishing method according to claim 4, wherein the hydrofluoric acid-containing solution contains a buffered hydrofluoric acid, dilute hydrofluoric acid or a mixture of hydrogen peroxide and hydrofluoric acid.

8. A polishing method according to claim 4, wherein the concentration of hydrofluoric acid in the hydrofluoric acid-containing solution is 1 to 50% by weight.

9. A polishing method according to claim 1, wherein the barrier metal film is a Ta-containing film or a Ti-containing film.

10. A polishing method according to claim 4, wherein the barrier metal film is a Ta-containing film or a Ti-containing film.

11. A polishing method according to claim 1, wherein the barrier metal film comprises Ta and/or TaN.

12. A polishing method according to claim 4, wherein the barrier metal film comprises Ta and/or TaN.

13. A polishing method according to claim 1, wherein the metal film is silver or copper.

14. A polishing method according to claim 4, wherein the metal film is silver or copper.

\* \* \* \* \*